United States Patent
Kowalski

[11] Patent Number: 5,291,434
[45] Date of Patent: Mar. 1, 1994

[54] MOS FUSE WITH OXIDE BREAKDOWN AND APPLICATION THEREOF TO MEMORY CARDS

[75] Inventor: Jacek Kowalski, Trets, France

[73] Assignee: Gemplus Card International, Gemenos, France

[21] Appl. No.: 551,565

[22] Filed: Jul. 11, 1990

[30] Foreign Application Priority Data

Jul. 13, 1989 [FR] France .................. 89 09547

[51] Int. Cl.⁵ .................. G11C 17/00; H01L 27/02; H01L 27/115
[52] U.S. Cl. .................. 365/96; 365/104; 365/185; 257/529; 257/922
[58] Field of Search .............. 365/96, 104, 185, 225.7; 357/51, 23.5; 257/50, 529, 530, 922

[56] References Cited

U.S. PATENT DOCUMENTS

| | | |
|---|---|---|
| 4,203,158 | 5/1980 | Frohman-Bentchkowsky ... 365/185 |
| 4,851,894 | 7/1989 | de Ferron et al. .................. 257/529 |
| 4,872,140 | 10/1989 | Graham et al. .................. 365/96 |
| 4,899,205 | 2/1990 | Handy et al. .................. 365/96 |
| 5,019,878 | 5/1991 | Yang et al. .................. 365/104 |
| 5,056,061 | 10/1991 | Akylas et al. .................. 365/96 |
| 5,099,451 | 3/1992 | Sourgen et al. .................. 365/104 |
| 5,146,307 | 9/1992 | Kaya .................. 257/530 |

FOREIGN PATENT DOCUMENTS 60-47297 3/1985 Japan.

OTHER PUBLICATIONS

Sato et al., "A New Programmable Cell Utilizing Insulator Breakdown", International Electron Devices Meeting, Wash., D.C., U.S., Dec. 1985, pp. 639–642.
Bhattacharyya et al., "Hard Coupled Sandwiched High Density Floating Gate Cell", IBM Technical Disclosure Bulletin, vol. 23, No. 2, Jul., 1980, pp. 543–545.

*Primary Examiner*—Joseph L. Dixon
*Assistant Examiner*—Michael A. Whitfield
*Attorney, Agent, or Firm*—Roland Plottel

[57] ABSTRACT

A MOS fuse with oxide breakdown based on a MOS cell electrically programmable by tunnel effect and storage of charges at a gate. This cell is converted into a fuse by providing for the application, when the fuse has to break down, of an intense field, greater than the oxide breakdown threshold, in the tunnel window. Thus, the breakdown is irreversible. The disclosed device can be applied notably to fuses designed for the integrated circuits of memory cards.

6 Claims, 1 Drawing Sheet

MOS FUSE WITH OXIDE BREAKDOWN AND APPLICATION THEREOF TO MEMORY CARDS

BACKGROUND OF THE INVENTION

1. Field of the Invention

The invention pertains to the field of MOS (Metal-/Oxide/Semiconductor) integrated circuits and, more particularly, to a fuse that can be used in such circuits.

2. Description of the Prior Art

The use of fuses in integrated circuits is very widespread, notably for the programming of read-only memories or in order to obtain a circuit configuration, after the breakdown (or blowing) of the fuse or fuses, that is different from the initial configuration. This is the case, for example, with integrated circuits for chip cards where the fuses, after their "breakdown" or "blowing", make it possible to block access to certain circuit zones. In general, this configuration cannot be established during the manufacture of the card, for it should be possible to have access to these zones to test the circuit and to customize it or adapt it to a specific need. It is only after this that the access to these zones must be prohibited. For this application, the security of the card is closely related to efficient breakdown of the fuses.

Other applications for fuses in integrated circuits are used, for example, in high-capacity memories for redundancy, the defective columns (or lines) being replaced after the breakdown of a corresponding fuse by supplementary columns (or lines).

There are various types of known fuses that can be used in integrated circuits, notably in programmable memories where the recording is done by the breakdown of a fuse or junction. The fuse is made in the form of a thin layer of metal consisting of an alloy of nickel and chrome or, especially, of a layer of polycrystalline silicon having excellent reliability, destroyed by the application of high power. The breakdown of the junction too calls for well-controlled conditions of breakdown with fairly high currents.

The main limitation as regards standard fuses, therefore, is the need to use high breakdown power, for example currents of 100 to 200 mA at 10 to 20 V. Now, this is incompatible with developments in the technology of integrated circuits, where the trend is towards reducing the consumption of the circuits and towards reducing the internal voltages and the breakdown voltages of the diodes or junctions.

Thus, it is more difficult to achieve the proper breakdown or blowing of a fuse in CMOS integrated circuits than in circuits of some years ago, especially because the voltage applied during the breakdown must be far lower than was the case previously.

Other problems too are poorly resolved, for example the unwanted breakdown of fuses mounted in parallel with fuses that have to be broken down: indeed, during the breakdown of a fuse, the conduction of the breakdown control transistor may cause the "stray" breakdown of a fuse which should not break down. The only way to resolve this problem consists in reducing the breakdown voltage, but this makes it more difficult to achieve the breakdown of the fuse which has to break down.

Another problem results from the breakdown of the fuse by electrostatic discharge. Indeed, this breakdown takes place under conditions which currently approach characteristics required at the inputs/outputs of the circuits. Thus, the breakdown by electrostatic discharge may take place for 500 V while the input/output voltages frequently reach 5000 V. It is therefore impossible to use fuses at the input/output pins and to achieve their breakdown.

To overcome these drawbacks, integrated circuit designers have developed and perfected electrically programmable (EPROM or EEPROM) MOS memory cells or "memory dots" for which the logic state, namely circuit open (0) or on (1), is determined by the existence or non-existence of charges that have collected at an floating (unconnected) gate. The programming of a cell such as this, namely the change from the "circuit open" state to the "circuit on" state, amounts to a shifting of the threshold of conduction by these charges that have collected at the floating gate.

A cell such as this, with two logic states, is equivalent to a fuse except as regards irreversibility. Indeed, the charges that have collected at the floating gate may be eliminated, for example by heating the circuit, by radioactivity, by electromagnetic wave effect or, again, through the compensation of these charges by charges stored in the thin oxide of the cells, between the source and drain electrodes and the floating gate. Now, the security of chip card type applications relies entirely on the fact that it should be impossible, after the breakdown of the fuse, to bring it back to the logic state existing before the breakdown.

SUMMARY OF THE INVENTION

An object of the invention is a fuse with a Metal/Oxide/Semiconductor structure that does not have the drawbacks of standard fuses in respect of the breakdown power values required and does not have the drawbacks, in terms of security, of MOS cells that can be programmed from an initial state to another state by the storage of charges.

According to the invention, there is proposed a MOS fuse with oxide breakdown, wherein said fuse is formed by a MOS cell comprising at least one electrode obtained by doping of a substrate, said substrate being coated with silicon oxide in which there is embedded at least one gate formed by polycrystalline silicon connected to an external contact terminal, the thickness of oxide between the gate and the electrode being thinned on all or on a part of the length of the gate-electrode coating to form an oxide window of small thickness, and wherein an irreversible breakdown of the oxide is obtained at the window, when necessary, by the application of an electrical field greater than a threshold of breakdown between the gate and the electrode.

An object of the invention is also the application of this fuse to memory cards.

BRIEF DESCRIPTION OF THE DRAWINGS

The invention will be understood more clearly, and other characteristics will appear from the following description, made with reference to the appended drawings, wherein.

DESCRIPTION OF A PREFERRED EMBODIMENT

Figure 1A:
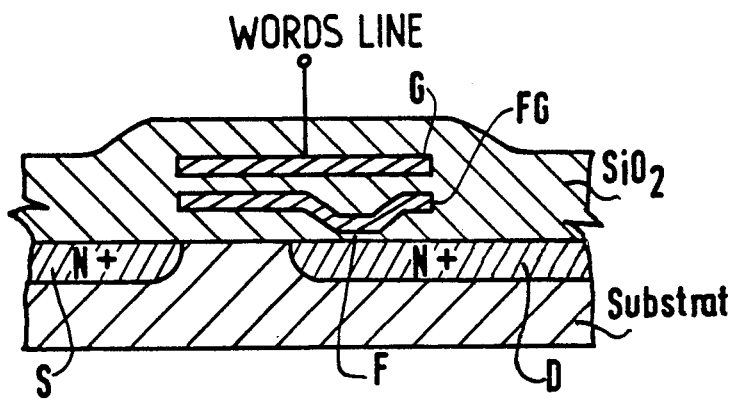
FIGS. 1a and 1b show a sectional drawing of a known programmable MOS circuit with floating gate, and the equivalent symbolic electrical diagram.

FIG. 1a shows the known electrically-erasable programmable MOS memory cell with tunnel effect: the silicon substrate is N+doped to form, firstly, the source S and, secondly, the drain D, and it is then covered with a layer of silicon oxide, a gate FG of polycrystalline silicon, called a "floating" gate because it is unconnected, and a second gate G at which there is provision for a contact point. With the drain, the floating gate forms, on a part of its length, a thin tunnel window F, typically with a 0.01 micrometer thickness of oxide obtained at least partly by growth. The contact point of the gate G is connected to a line of words. As indicated above, the programming of a cell such as this is obtained by tunnel effect, and an intense electrical field, typically 10 mV/cm, enables the electrical charges to go through the oxide window of the tunnel and get stored at the floating gate FG. Depending on the direction of the electrical field, the stored charges are either holes or electrons. For a 0.01 micrometer oxide window, a voltage of 10 V has to be applied to the floating gate FG to obtain an electrical field that is sufficient to enable the charges to go through by tunnel effect.

For this purpose, the voltage applied to the gate G by the "line of words" (word lines) should be determined in taking account of the coefficient of capacitive coupling between the two gates G and FG. For example, if this coupling coefficient is equal to 0.5, the voltage applied to G should be equal to 20 V to obtain 10 V by capacitive coupling at the gate FG and trigger the tunnel effect, the drain being kept at 0 V. In the same way, it is enough to apply 20 V to the drain of the cell, while keeping the gate at 0 V, to trigger the transfer of charges by tunnel effect with an inverted electrical field. When a cell such as this is "erased" (with electrons stored at the floating gate FG), its threshold voltage $VT_0$ is equal to about 5 V; a "programmed" cell (with holes stored at the floating gate) has its threshold voltage $VT_1$ equal to about 3 V. If, for the reading, a voltage of 2 V is applied to the gate G, the erased cell is off and the programmed cell is on.

Figure 1B:
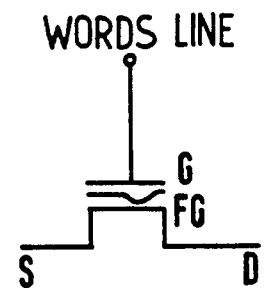

The oxide of the tunnel window beneath the gate FG and the drain is a very flimsy element because of its small thickness. This thin layer oxide structure between the drain and the gate, to form the window, is necessary so that the conduction by tunnel effect can take place. This effect takes place just before the electrostatic breakdown of the oxide. For example, if the tunnel effect is triggered by an electrical field between 8 and 10 MV/cm, the breakdown of the oxide occurs for an electrical field of about 12 MV/cm or even less if the electrical field is applied suddenly. In EEPROM cells of this type, the voltage necessary during the programming is increased very slowly, at 20 V/ms, to prevent the breakdown of the oxide. FIG. 1b shows the equivalent electrical diagram of this cell with a source S, drain D, gate G and intermediate floating gate FG, at a very small distance (0.01 micrometer) from the drain on a part of its length.

To make the fuse, the invention uses a structure that is quite similar but, instead of programming the cell as described above, the oxide of the tunnel is "broken down" and a low resistance is then set up between the drain and the gate FG. For this purpose, the two gates G and FG are interconnected and, preferably, instead of raising the programming voltage slowly, this voltage is raised rapidly. The interconnection of the two gates enables the capacitive coupling between the two gates to be eliminated by setting up a direct link between them. Furthermore, one of the terminals of the resistor formed by the tunnel oxide can be grounded. Thus, under the same conditions of applied voltage as for the above described cell used in a memory, an electrical field of 20 MV/cm is obtained between G (and FG) and the drain D. This is quite sufficient to obtain the breakdown of the oxide in the window. Furthermore, the fast application of the voltage makes it possible to obtain a very efficient breakdown of the tunnel oxide and, hence, the lowest possible resistance between the drain and the gate. This condition of fast application of the breakdown voltage is not indispensable because, with voltages of this amplitude, the tunnel oxide will in any case undergo breakdown. Nevertheless, when the voltage is applied more slowly, the breakdown is less definite and a slightly higher resistance may remain between the drain and the gate.

Figure 2A:
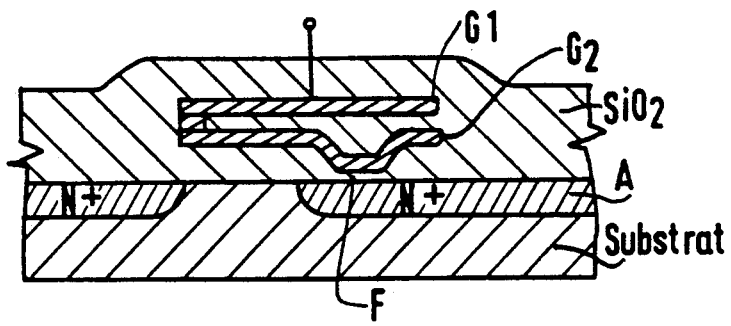
FIGS. 2a and 2b show a drawing of the MOS fuse with oxide breakdown according to the invention and the corresponding symbolic electrical diagram.
Figure 2B:
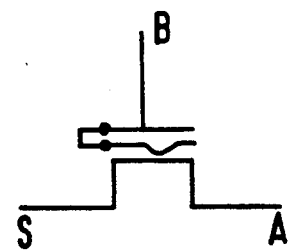

FIG. 2a gives a sectional view of the corresponding structure of the fuse, similar to that of the memory cell, but with the two gates interconnected. They are marked G1 and G2 in this figure because there is no longer any "floating" gate. The breakdown voltage is applied between the terminal B (gates) and the terminal A (connection of drain D in FIG. 1a). The doped zone corresponding to the source S of figure 1a is not connected i.e. left floating. FIG. 2b is the equivalent symbolic electrical diagram.

Figure 3:
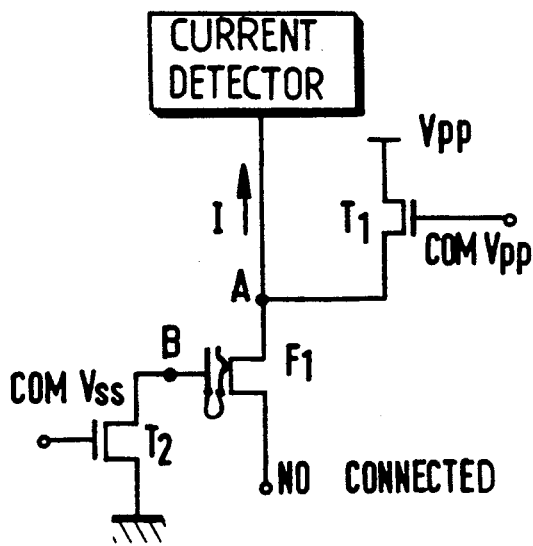
FIG. 3 is the diagram of the assembly necessary for the breakdown of the fuse.
Figure 4:
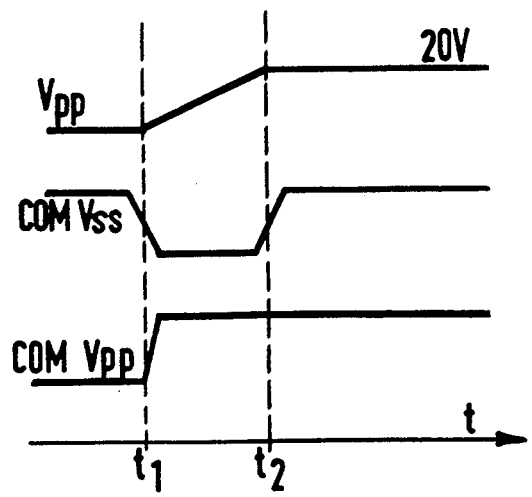
FIG. 4 is a timing diagram of the corresponding control voltages.

FIG. 3 illustrates the assembly used to achieve the breakdown of the oxide which makes the fuse go from its initial "open" state to its "on" state when necessary, this being an irreversible change. As shown in FIG. 2b, the fuse F1 represented therefore has an unconnected terminal, its terminal A connected to a supply voltage Vpp through a transistor T1, the gate of which is connected to a control terminal COMVpp, and its terminal B connected to to the ground through a transistor T2, the gate of which is connected to a control terminal COMVss. To break down this "fuse", the control signal of T2, COMVpp is increased up to the supply voltage Vpp, whereas the control signal COMVss, initially at the high state, is brought to ground. At the instant t1 in the timing diagram of FIG. 4, the transistor T2 goes off and T1 starts being on. The voltage at the node B remains floating. No electrical field is then generated through the tunnel oxide. At the instant t2, the voltage at the node A is Vpp=20 V and the voltage at the node B is 0 V. An intense electrical field of 20 MV/cm therefore exists in the tunnel window which rapidly breaks down. A leakage towards the ground of the current detector appears, and this makes the potential at the node A go down. The breakdown phenomenon then stops.

During detection, the voltage COMVpp applied to the gate of T1 is equal to 0 V, and the transistor T1 is off. The voltage COMVss applied to the gate of T2 equals 5 V (all that has to be done is to make T2 conductive) and this takes the gates (node B) of the fuse cell F1 to Vss (0 V).

When the oxide of the tunnel window is intact, there is no current in the fuse cell F1, and the current detector indicates this absence of current;

When the oxide breaks down, there is a low resistance between A and B. This induces a-current I towards the ground of the detector, and a different state is then detected.

This phenomenon of breakdown is irreversible. No heating (annealing) of the circuit can change the structure of the oxide that has broken down. Furthermore, since the effect is not that of a storage of charges, no test on the discharging or storage of charges in the thin oxide of the cell can affect the state of the fuse cell. This breakdown is fast (1 ms) as compared with the time of about 5 ms needed for programming a cell (FIG. 1a) or the time of about 100 ms needed for the breakdown of a standard fuse. No power is needed and, since the internal generator of voltage Vpp is used for the breakdown of the oxide, it is possible, in the context of an application to integrated circuits for cards, to provide for the burn-out of one or more fuses of the circuit as soon as an anomaly is observed, with its being possible for any fraudulent person to prevent this from happening.

A structure such as this can also be used to build memories with a single programming. Thus, memory cards may be customized by irreversible changes in the structure of the circuits by breakdown of oxide. Usually, as indicated above, when the customizing is obtained by special arrangements during manufacture, it calls for costly and slow masking operations of little flexibility, and when the customizing is done by the electrical programming of EPROM or EEPROM cells, the resulting structures are vulnerable.

In practice, to convert a cell such as the one shown in FIG. 1a into a fuse such as the one shown in FIG. 2a, it is enough, during the operation for depositing silicon oxide on the floating gate, to reserve a zone for the contact between the two gates, the contact being obtained when the polycrystalline silicon of the second gate is deposited in the reserved zone. Another possibility would be to provide for accessible contact points on the floating gate of each and every cell of this type, and to connect these points to the word lines of only those cells used as fuses.

The invention is not restricted to the structure as described here above with reference to FIGS. 2a and those that follow it. Indeed, since EEPROM cells with tunnel effect are perfectly well known, it has been proposed to make a fuse with oxide breakdown by using the same structure with only one supplementary connection between the two gates. Clearly, this structure is worthwhile because it exists. However, if a fuse with oxide breakdown were to be made specially to work as described above, it would be seen that the "source" electrode could be eliminated because it is not used, as would be the case for the gate G1 if the gate connection were to be taken directly at G2. The minimum structure is thus formed by the substrate with its doped (N+ doped for example) electrode, the oxide and the gate forming a tunnel window F in a zone of the oxide above the electrode.

What is claimed is:

1. A MOS fuse with oxide breakdown, wherein said fuse is formed by a MOS cell comprising at least one electrode obtained by doping of a substrate, said substrate being coated with silicon oxide in which there is embedded at least one gate of polycrystalline silicon connected to a contact terminal, a thickness of oxide between the gate and the electrode being thin on all or on a part of the oxide between the gate and the electrode to form an oxide window of sufficiently small thickness to have a tunnel effect thereat, and wherein an irreversible breakdown of the oxide is obtained at the window by application of an electrical field, greater than a threshold of breakdown of said oxide of said oxide window which is between the gate and the electrode, wherein said MOS cell is a modified electrically programmable MOS cell comprising a second electrode formed by doping of the substrate, and a second gate separated from the first one by a layer of oxide, and the two gates are interconnected to speed the application of the electrical field for breakdown of the oxide in the oxide window.

2. A fuse according to claim 1 wherein, the thickness of the oxide of the oxide window is of the order of 0.01 micrometer, and the electrical field is greater than 12 MV/cm to cause breakdown of said oxide of said oxide window.

3. A memory card comprising the fuse, according to claim 1 wherein the memory comprises at least one of the fuses for irreversible blocking, after customizing of the card, of access to certain zones of circuits of these cards.

4. A memory card according to claim 3, wherein said thickness of the oxide of said oxide window is on the order of 0.01 micrometers.

5. A memory array comprising fuses according to any of the claims 1 or 2 or 3, to form its memory cells, said memory cells being thus programmable by oxide breakdown.

6. A memory array according to claim 5, wherein said thickness of the oxide of said oxide window is on the order of 0.01 micrometers.

* * * * *